United States Patent
Howlader

(10) Patent No.: US 10,305,631 B1
(45) Date of Patent: May 28, 2019

(54) SYSTEM AND METHOD FOR FRAME SYNCHRONIZATION

(71) Applicant: RAYTHEON COMPANY, Waltham, MA (US)

(72) Inventor: Mostofa K. Howlader, Tucson, AZ (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 15/816,953

(22) Filed: Nov. 17, 2017

(51) Int. Cl.
*H04L 1/00* (2006.01)
*H03M 13/25* (2006.01)

(52) U.S. Cl.
CPC .......... *H04L 1/006* (2013.01); *H03M 13/256* (2013.01); *H04L 1/0041* (2013.01); *H04L 1/0045* (2013.01)

(58) Field of Classification Search
None
See application file for complete search history.

(56) References Cited

U.S. PATENT DOCUMENTS

| | | | | |
|---|---|---|---|---|
| 6,411,664 B1 * | 6/2002 | Usui | ........................ | H04L 5/22 375/259 |
| 6,515,960 B1 * | 2/2003 | Usui | ....................... | H04L 5/023 370/203 |
| 6,810,097 B1 * | 10/2004 | Yamagata | ............... | H04N 19/89 375/344 |
| 7,050,511 B2 * | 5/2006 | Jeong | .................... | H04L 1/0041 375/265 |
| 2004/0091074 A1 * | 5/2004 | Febvre | .................. | H04J 3/0602 375/368 |
| 2009/0274247 A1 * | 11/2009 | Galbraith | ......... | G11B 20/10009 375/341 |

OTHER PUBLICATIONS

Cassaro, Thomas M. et al., Frame Synchronization for Coded Systems Over AWGN Channels, IEEE Transactions on Communications, vol. 52, No. 3, Mar. 2004, pp. 484-489.
Lui, Gee L., et al., Frame Synchronization for Gaussian Channels, IEEE Transactions on Communications, vol. Com-35, No. 8, Aug. 1987, pp. 818-829.

(Continued)

*Primary Examiner* — Mujtaba M Chaudry
(74) *Attorney, Agent, or Firm* — Lewis Roca Rothgerber Christie LLP

(57) ABSTRACT

A system for frame synchronization. Coarse synchronization is performed, in some embodiments, by using soft bit decisions to generate a list of candidate frame start positions, each with an associated estimated probability. The candidate frame start positions are then tested by decoding the frame data, and a frame start position for which a criterion of decoding success is met is selected. Fine synchronization is performed, in some embodiments, by using an encoded synchronization word in the encoded frame data. A first decoding pass is used to identify the position of the synchronization word. The start of the frame is inferred from the position of the synchronization word, and a second decoding pass, using the correct initial state, in the decoder, at the start of the encoded frame data, is performed.

18 Claims, 7 Drawing Sheets

(56) References Cited

OTHER PUBLICATIONS

Massey, James, L., Optimum Frame Synchronization, IEEE Transactions on Communications, vol. COM-20, No. 2, Apr. 1972, pp. 115-119.
Moon, Byung H. et al., ML Frame Synchronization for the Gaussian Channel with ISI, IEEE, ICC, Jun. 1991, pp. 1698-1702.
Neilson, P. Tolstrup et al., Some Optimum and Suboptimum Frame Synchronizers for Binary Data in Gaussian Noise, IEEE Transactions on Communications, Jun. 1973, pp. 770-772.
Robertson, Patrick, A Generalized Frame Synchronizer, IEEE Globalcom, Dec. 1992, pp. 365-369.
Robertson, Patrick, Improving Frame Synchronization When Using Convolutional Codes, IEEE Globalcom, Dec. 1993, pp. 1606-1611.
Schaub, T., et al., Frame Synchronization for Spontaneous Transmissions, in Proc. IEEE Globalcom, Nov. 1990, pp. 617-622.
Wu, Yufei et al., A Simple Stopping Criterion for Turbo Decoding, IEEE Communications Letters, vol. 4, No. 8, Aug. 2000, pp. 258-260.

\* cited by examiner

SYSTEM AND METHOD FOR FRAME SYNCHRONIZATION

FIELD

One or more aspects of embodiments according to the present invention relate to synchronization, and more particularly to decoder-assisted frame synchronization.

BACKGROUND

Digital communications systems using frame transmission may, for each received frame, perform frame synchronization using a systematic search for a known sequence of bits in a header at the start of each frame, followed by decoding of the data following the header, which may be encoded, e.g., with an error-correcting code.

Such a system may fail to realize potential performance that may be achieved by performing decoder-assisted synchronization.

SUMMARY

Aspects of embodiments of the present disclosure are directed toward a system for frame synchronization. Coarse synchronization is performed, in some embodiments, by using soft bit decisions to generate a list of candidate frame start positions, each with an associated estimated probability. The candidate frame start positions are then tested by decoding the frame data, and a frame start position for which a criterion of decoding success is met is selected. Fine synchronization is performed, in some embodiments, by using an encoded synchronization word in the encoded frame data. A first decoding pass is used to identify the position of the synchronization word. The start of the frame is inferred from the position of the synchronization word, and a second decoding pass, using the correct initial state, in the decoder, at the start of the encoded frame data, is performed.

According to an embodiment of the present invention there is provided a method for processing a frame in a data transmission system including a transmitter and a receiver, the method including: processing a second plurality of bits from among a first plurality of bits, with a first trellis decoder, to form a third plurality of bits; identifying the position of a first synchronization word within the third plurality of bits; and extracting a decoded data payload from the first plurality of bits.

In one embodiment, the extracting of the decoded data payload includes: identifying a first frame start position within the first plurality of bits, the first frame start position preceding the position of a bit, in the first plurality of bits, corresponding to a first bit of the first synchronization word, by a set number of bits; initializing a second trellis decoder to a set initial state; and processing a fourth plurality of bits, from among the first plurality of bits, with the second trellis decoder, a first bit of the fourth plurality of bits being a bit at the first frame start position within the first plurality of bits.

In one embodiment, the set number is greater than 0.1 times the number of bits in the first plurality of bits and the set number is less than 0.8 times the number of bits in the first plurality of bits.

In one embodiment, the first trellis decoder is the same as the second trellis decoder.

In one embodiment, the second plurality of bits is the same as the first plurality of bits.

In one embodiment, the method includes: receiving, in the receiver, a plurality of soft bit decisions; generating a plurality of candidate frame start positions, each associated with a respective probability; forming a third plurality of bits from the plurality of soft bit decisions, a first one of the third plurality of bits corresponding to a bit at a first start position of the candidate frame start positions; initializing a second trellis decoder to a set initial state; processing the third plurality of bits with the second trellis decoder, to generate a set of decoded bits and a bit error count; when the bit error count is less than or equal to a threshold: outputting the third plurality of bits; and when the bit error count is greater than the threshold: forming a fourth plurality of bits from the plurality of soft bit decisions, a first one of the third plurality of bits corresponding to a bit at a second start position of the candidate frame start positions, the second start position having associated with it a lower probability than the first start position; initializing the second trellis decoder to the set initial state; and processing the fourth plurality of bits with the second trellis decoder, to generate a set of decoded bits and a bit error count.

In one embodiment, the generating of the plurality of candidate frame start positions includes correlating a second synchronization word against the plurality of soft bit decisions.

In one embodiment, the method includes: receiving, in the transmitter, a sixth plurality of bits; inserting, into the sixth plurality of bits, the second synchronization word, to form a seventh plurality of bits; encoding the seventh plurality of bits with a convolutional encoder to form an eighth plurality of bits; and transmitting the eighth plurality of bits to the receiver.

In one embodiment, the inserting into the sixth plurality of bits, of the second synchronization word, includes inserting the second synchronization word at a position in the sixth plurality of bits such that: at least 10% of the sixth plurality of bits precede the second synchronization word in the seventh plurality of bits; and at least 10% of the sixth plurality of bits precede the inserted in the seventh plurality of bits.

In one embodiment, the second synchronization word is a Barker code.

According to an embodiment of the present invention there is provided a system for processing a frame in a data transmission system including a transmitter and a receiver, the system including a processing circuit configured to: process a second plurality of bits from among a first plurality of bits, with a first trellis decoder, to form a third plurality of bits; identify the position of a first synchronization word within the third plurality of bits; and extract a decoded data payload from the first plurality of bits.

In one embodiment, the extracting of the decoded data payload includes: identifying a first frame start position within the first plurality of bits, the first frame start position preceding the position of a bit, in the first plurality of bits, corresponding to a first bit of the first synchronization word, by a set number of bits; initializing a second trellis decoder to a set initial state; and processing a fourth plurality of bits, from among the first plurality of bits, with the second trellis decoder, a first bit of the fourth plurality of bits being a bit at the first frame start position within the first plurality of bits.

In one embodiment, the set number is greater than 0.1 times the number of bits in the first plurality of bits and the set number is less than 0.8 times the number of bits in the first plurality of bits.

In one embodiment, the first trellis decoder is the same as the second trellis decoder.

In one embodiment, the second plurality of bits is the same as the first plurality of bits.

In one embodiment, the processing circuit is further configured to: receive, in the receiver, a plurality of soft bit decisions; generate a plurality of candidate frame start positions, each associated with a respective probability; form a third plurality of bits from the plurality of soft bit decisions, a first one of the third plurality of bits corresponding to a bit at a first start position of the candidate frame start positions; initialize a second trellis decoder to a set initial state; process the third plurality of bits with the second trellis decoder, to generate a set of decoded bits and a bit error count; when the bit error count is less than or equal to a threshold: output the third plurality of bits; and when the bit error count is greater than the threshold: form a fourth plurality of bits from the plurality of soft bit decisions, a first one of the third plurality of bits corresponding to a bit at a second start position of the candidate frame start positions, the second start position having associated with it a lower probability than the first start position; initialize the second trellis decoder to the set initial state; and process the fourth plurality of bits with the second trellis decoder, to generate a set of decoded bits and a bit error count.

In one embodiment, the generating of the plurality of candidate frame start positions includes correlating a second synchronization word against the plurality of soft bit decisions.

In one embodiment, the processing circuit is further configured to: receiving, in the transmitter, a sixth plurality of bits; inserting, into the sixth plurality of bits, the second synchronization word, to form a seventh plurality of bits; encoding the seventh plurality of bits with a convolutional encoder to form an eighth plurality of bits; and transmitting the eighth plurality of bits to the receiver.

In one embodiment, the inserting into the sixth plurality of bits, of the second synchronization word, includes inserting the second synchronization word at a position in the sixth plurality of bits such that: at least 10% of the sixth plurality of bits precede the second synchronization word in the seventh plurality of bits; and at least 10% of the sixth plurality of bits precede the inserted in the seventh plurality of bits.

In one embodiment, the second synchronization word is a Barker code.

BRIEF DESCRIPTION OF THE DRAWINGS

Features, aspects, and embodiments are described in conjunction with the attached drawings, in which.

DETAILED DESCRIPTION

The detailed description set forth below in connection with the appended drawings is intended as a description of exemplary embodiments of a system and method for frame synchronization provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

Related art communications systems may form frames by adding a unique sequence of bits, or "preamble" to the beginning of each frame before transmission. The receiver may then search the received stream of data for the preamble, to identify the position, in the received stream of bits, of the beginning of the frame. Based on this information, the receiver may then identify the range of positions, in the received stream of bits of the data payload (which may be encoded with an error correcting code), and decode and output the data. The preamble may be un-encoded.

In some embodiments of the present invention (as described in further detail below), a data word, referred to as a synchronization word, is instead embedded, by the transmitter, within the payload, before the payload (with the embedded synchronization word) is encoded. The receiver, using approximate information regarding the positions of the beginning and end of the payload, decodes the payload, finds the synchronization word, determines, from the position of the synchronization word, the exact positions of the beginning and end of the payload, and again decodes the payload. The second decoding of the payload may exhibit superior error-correcting performance over the first decoding, because, when performing the second decoding, the decoding circuit may have information regarding the initial state of the encoder.

Figure 1:
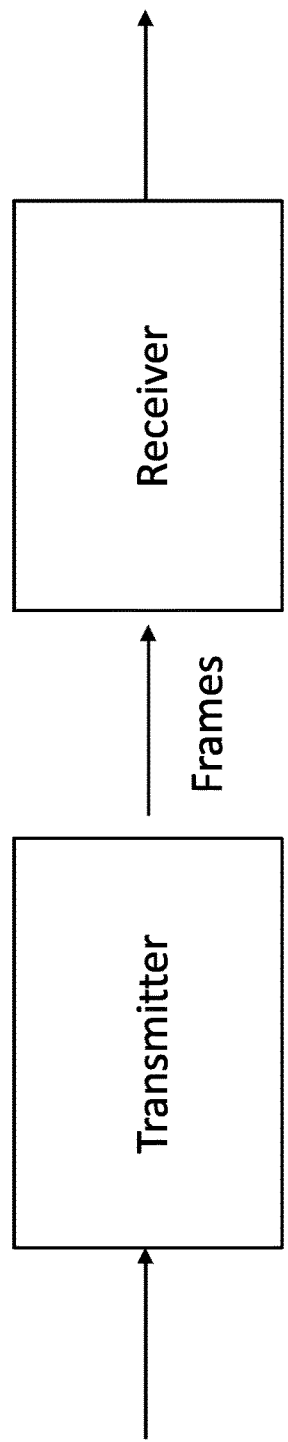
FIG. 1 is a block diagram of a communications system, according to an embodiment of the present invention.
Figure 2:
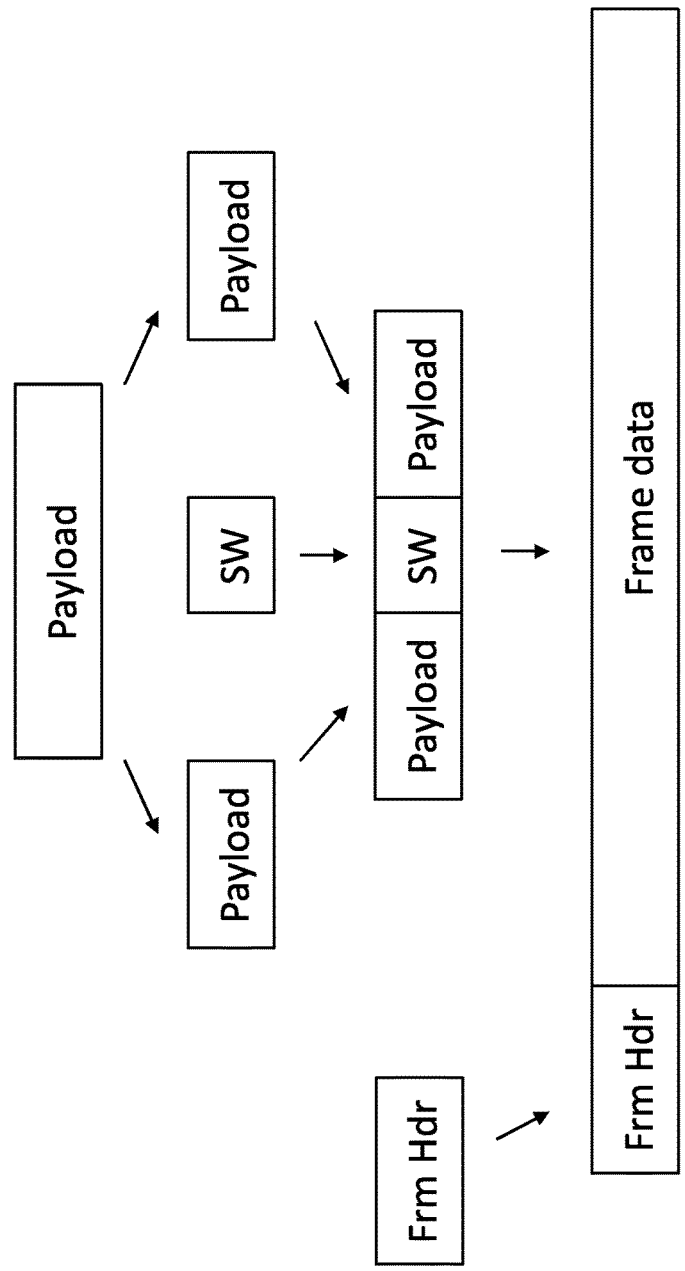
FIG. 2 is a frame structure diagram, according to an embodiment of the present invention.

Referring to FIG. 1, in some embodiments, a transmitter receives data to be transmitted, and transmits it in frames over a transmission channel, to a receiver, which then extracts and outputs the data. Referring to FIG. 2, in some embodiments, each frame is formed as follows. The payload (which consists of data received by the transmitter) is separated into two parts, and a synchronization word (SW) is inserted between the two parts of the payload to form a sequence of bits including the payload and the synchronization word. This sequence of bits is encoded, e.g., using a convolutional encoder, to form an encoded sequence of bits, that may be referred to herein as the "frame data". The convolutional encoder may be a finite state machine and it may be reset to the same set initial state at the beginning of each frame (so that it is in the set initial state when the sequence of bits including the payload and the synchronization word is encoded). The encoded sequence of bits may include redundant information that may be used, in the receiver, to correct errors, and it may, as shown, be longer than the sequence of bits including the payload and the synchronization word. A frame header may be added to the frame data to form the frame. Termination bits (not shown) may also be added to (e.g., to the end of) the frame.

The receiver may receive a stream of bits. When the stream of data is uninterrupted (consisting, e.g., of a contiguous sequence of frames), the start position of any frame (i.e., the position of the first bit of each frame) may be known if the start position of the previous frame is known (and if, for example, all of the frames have the same length). When the stream of data is interrupted briefly (e.g., by interference if the transmission channel is a wireless transmission channel), then the start position of the next frame after the interruption may not be precisely known (e.g., because of slight differences in clock frequencies in the transmitter and receiver) but it may be approximately known (e.g., to within 5 or 10 bits). If the frame header is of fixed length, the start position of the frame data may readily be determined from the start position of the frame (i.e., by adding the frame header length to the start position of the frame).

Figure 3:
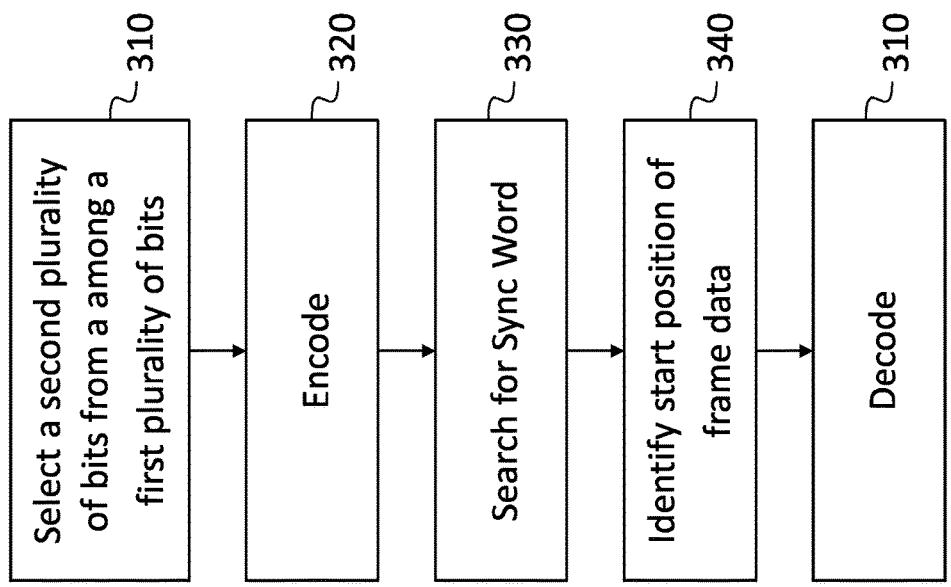
FIG. 3 is a flow chart of a method for synchronization and decoding, according to an embodiment of the present invention.

Upon receipt of a sequence of bits after a brief interruption of the connection between the transmitter and the receiver, the receiver may process the first sequence of bits as illustrated in FIG. 3. After receiving a first sequence of bits (or a first plurality of bits), a processing circuit in the receiver may extract (in an act 310), from the first sequence of bits, a second sequence of bits, corresponding approximately to one frame, and including a few additional bits (e.g., 5 additional bits), from the first sequence of bits, on each end to account for uncertainty about where the beginning and end of the frame are in the first sequence of bits. The processing circuit may be a digital circuit, as described in further detail below. The processing circuit then decodes, in an act 320, the sequence of bits with a trellis decoder, to form a third sequence of bits. The trellis decoder may create a sequence of output bits (the third sequence of bits) by, for each output bit, estimating the state of the convolutional encoder when the same bit was read into the encoder.

The error correction performance of the trellis decoder may be relatively poor at the beginning and end of the second sequence of bits, because the trellis decoder may lack information about the state of the convolutional encoder corresponding to times preceding and following the ends of the second sequence of bits. Near the center of the second sequence of bits, however, the performance of the trellis decoder is robust regardless of the incorrect starting/end of the trellis, because, for example, the effect of an incorrect assumption about an initial state of the convolutional encoder may have dissipated once a sufficiently large number of bits (of the second sequence of bits) has been processed by the trellis decoder. Accordingly, if the synchronization word is near the center of the second sequence of bits, it may be decoded with a low probability of error.

Figure 4:
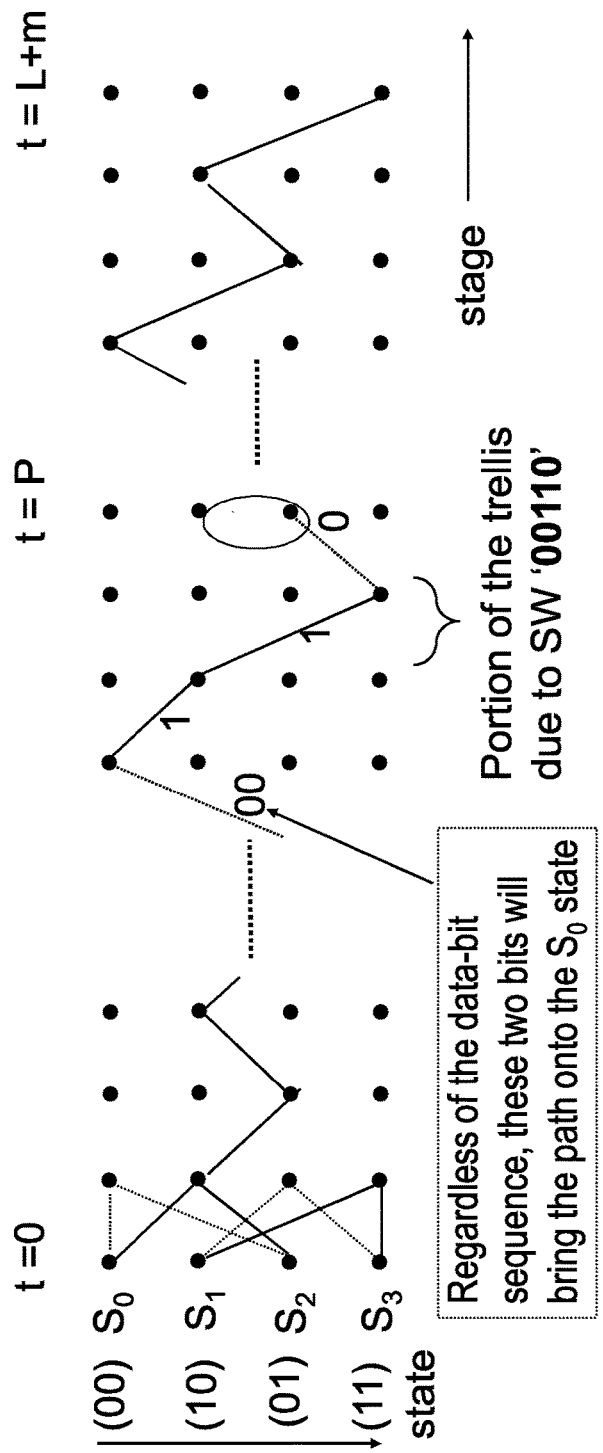
FIG. 4 is a trellis diagram, according to an embodiment of the present invention.

The processing circuit may then find, in an act 330, the synchronization word in the third sequence of bits, and infer, in an act 340, the start position of the frame data. Referring to FIG. 4, the synchronization word may be selected to be one that causes the encoder and the decoder to be in each state exactly once. For example, for the four-state encoding and decoding system for which the trellis diagram is shown in FIG. 4, the synchronization word causes the encoder (and the decoder) to be in the $S_0$ state (after receiving the first two bits, 00, and then to transition to the $S_1$ state, the $S_3$ state, and the $S_2$ state (i.e., the synchronization word 00110 has the property of causing the encoder and the decoder to be in each state exactly once). This may facilitate determining the start position of the frame within the first sequence of bits. For example, if the start position is 45 bits earlier than the position of the bit that results in the transition to the $S_3$ state within the synchronization word, then the receiver need only identify the bit, within the synchronization word, that resulted in the transition to the $S_3$ state (there is only one such bit position within the synchronization word because the decoder is in each state exactly once) and subtract 45 to calculate the start position of the frame.

Once the start position of the frame data is known, the processing circuit may again decode the frame data, using the trellis decoder and an initial state that is the same as the initial state used by convolutional encoder. This use of the correct initial state may result in significantly better performance (e.g., a lower residual error rate after decoding).

At system startup or after a prolonged interruption of the connection between the transmitter and the receiver, the uncertainty regarding the start position of the next frame after the interruption may be sufficiently great that arranging for the synchronization word to be within the second sequence of bits may involve using a relatively long sequence of bits as the second sequence of bits (e.g., using a second sequence of bits that is about twice as long as a frame). In such an approach, the cost of decoding the second sequence of bits to find the synchronization word may be relatively high.

Accordingly, the processing circuit in the receiver may be configured to use an alternate initial synchronization method when the uncertainty regarding the start position of the next frame is relatively high. For example, the frame header may be, or may include, a "preamble", i.e., a unique sequence of bits that identifies the start position of the frame. The preamble may be un-encoded (i.e., not encoded by the convolutional coder, and instead added to the frame after other parts of the frame have been encoded). The preamble may be a Barker code or any other code with desired cross-correlation property under noisy channel.

Figure 5:
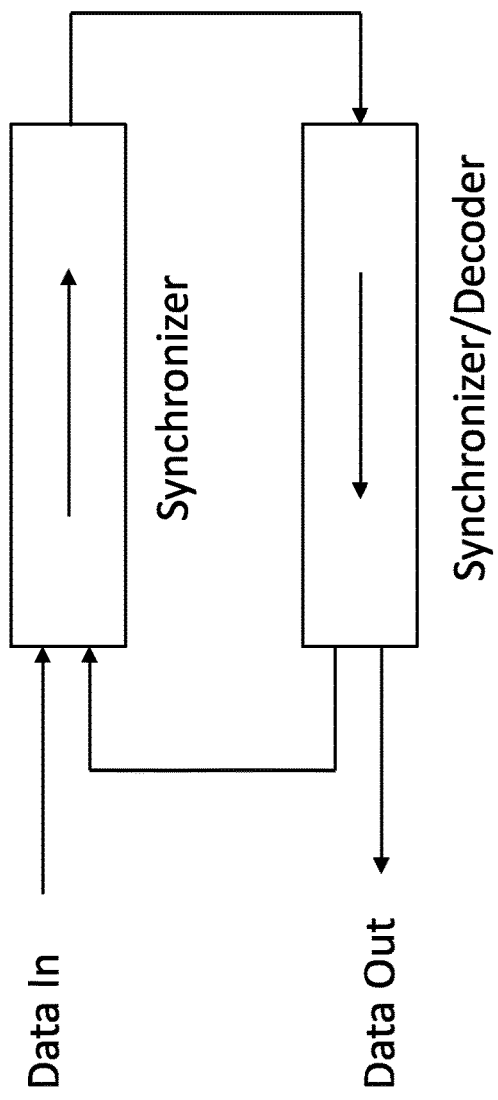
FIG. 5 is a diagram of decoder-assisted synchronization, according to an embodiment of the present invention.

To find the start position of the frame using the preamble, the processing circuit of the receiver may employ an iterative approach illustrated in FIGS. 5 (at a high level) and 6 (in greater detail), using soft bit decisions as described in further detail below. The raw data stream received from the transmission channel by the receiver may be affected by various sources of imperfection including, for example, attenuation, noise, and interference, and as a result the portions of the signal corresponding to individual bits may not consistently take the nominal value associated with the bit that was transmitted. Accordingly, the receiver may have a front end for classifying each such portion of the received signal. The front end may make hard decisions, producing, for each portion of the received signal either a 1 or a 0 (these hard decisions may on occasion be incorrect because of the imperfections of the received signal). The receiver may also, in the alternative, produce soft bit decisions. As used herein, a soft bit decision is an estimated probability of a bit having a true value of 0 or 1. The receiver may include, for example, an analog to digital converter and a lookup table generating the soft bit decisions, each of which may represent, for example, the estimated probability (represented as a fixed-point binary number) of the bit having a true value of 1, or each soft bit decision may be a binary number that corresponds to this probability without being equal or proportional to the probability.

Figure 6:
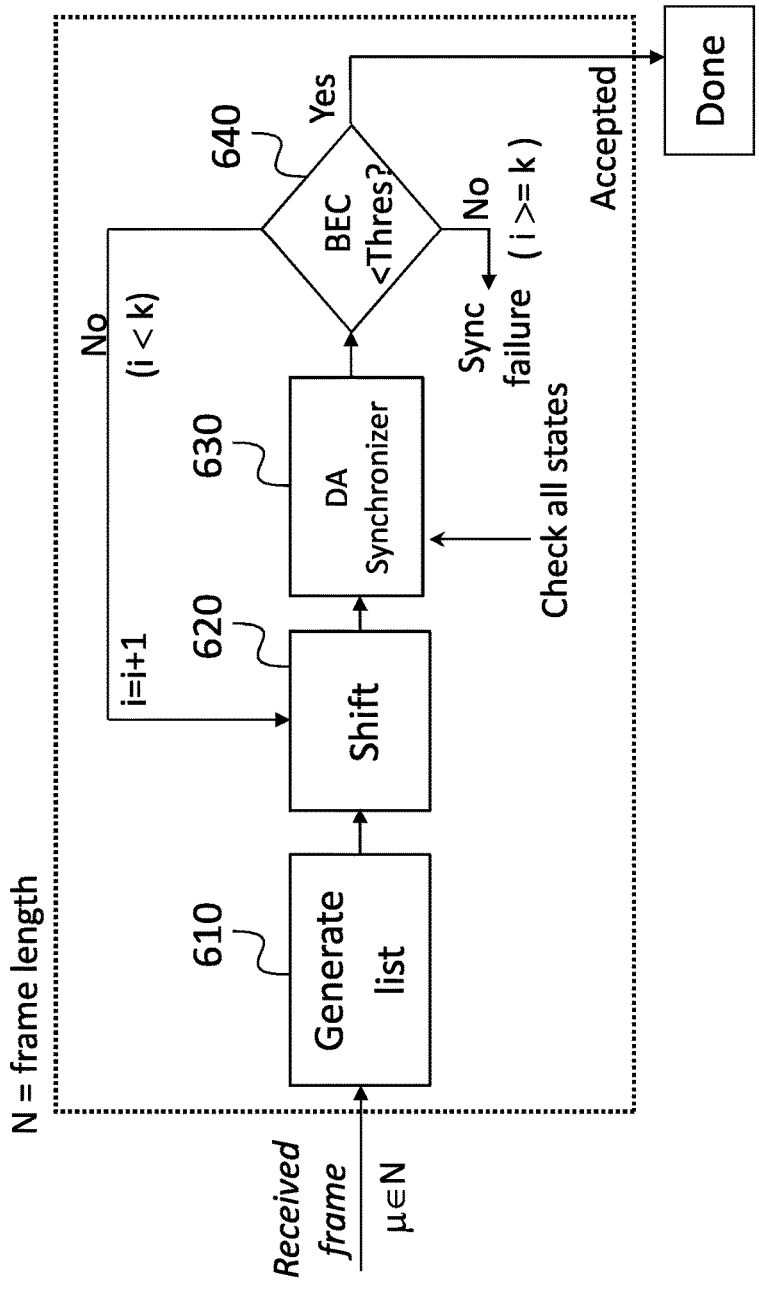
FIG. 6 is a diagram of decoder-assisted synchronization, according to an embodiment of the present invention.

As shown in FIG. 6, the processing circuit of the receiver may, in an act 610, calculate, using a sequence of soft bit decisions, an estimated probability of the start position of the frame being at any one of a set of candidate start positions within the sequence of soft bit decisions. It may then iteratively test, in order of decreasing estimated probability, each tentative start position of the candidate start positions. This may be accomplished by shifting, in an act 620, to the tentative start position, and attempting, in an act 630, to decode the encoded data within the frame, using the assumption, within each iteration, that the respective tentative start position is the start position of the frame (and setting the initial state of the trellis decoder accordingly). Each such decoding attempt may produce both a sequence of decoded bits and a bit error count (i.e., a count of the number of errors corrected by the trellis decoder). The processing circuit may then select one of the candidate start positions, e.g., by selecting the one with the lowest bit error count, or the first one tested for which the bit error count falls below a first set threshold. For example, in the embodiment of FIG. 6, the iterative process ends when the bit error count ("BEC") in act 640 is less than the first set threshold. When the number of iterations exceeds a second threshold, the process ends with a synchronization failure (and may be attempted again with another frame).

Figure 7:
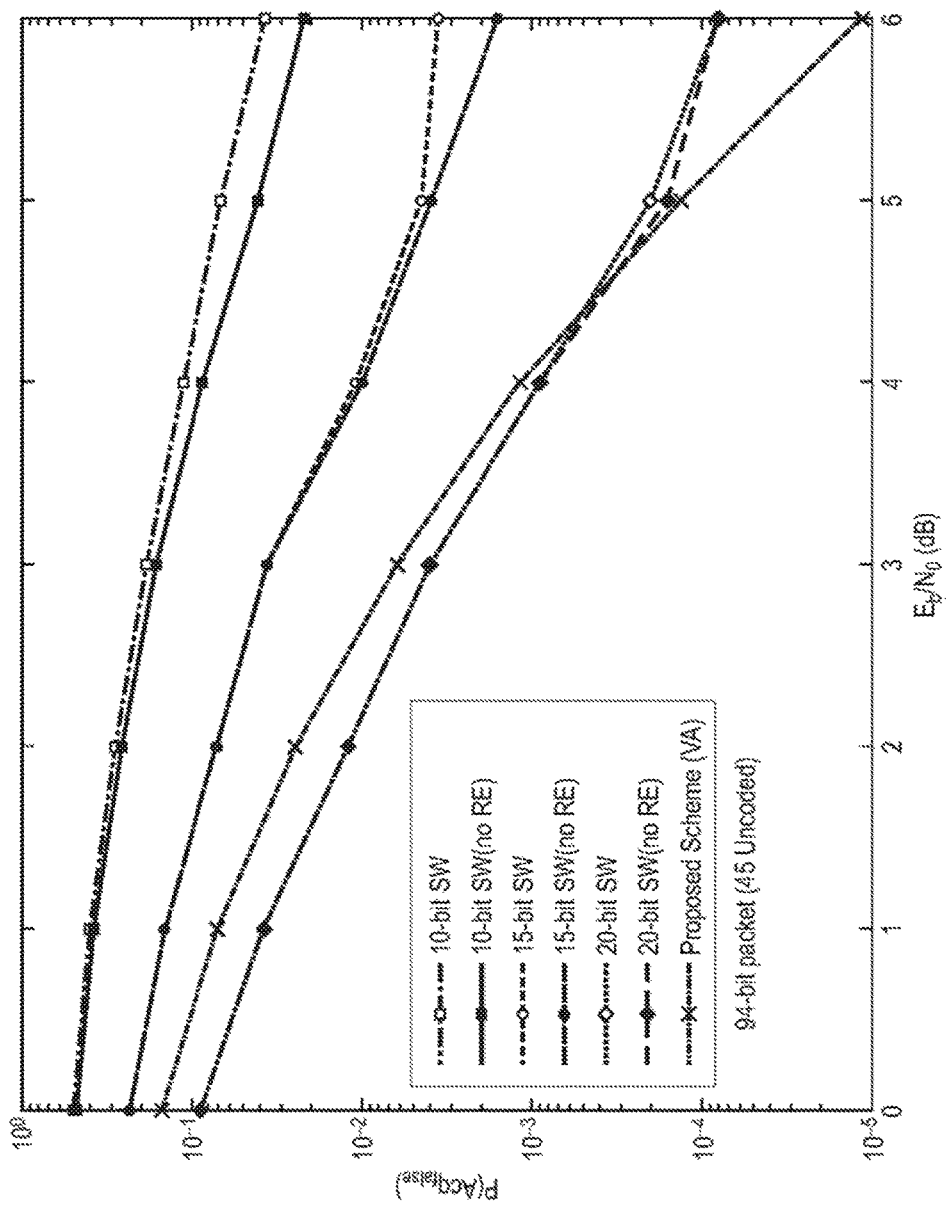
FIG. 7 is a graph showing simulated performance, according to an embodiment of the present invention.

FIG. 7 shows simulated performance for various configurations. Seven curves are identified in the legend, referred to herein as the first curve 1 (labeled "10-bit SW" in the legend) through the curve 7 (labeled "proposed scheme" in the legend). Curves 1-6 show simulated performance for a correlation-based algorithm with various synchronization word (SW) lengths, each simulated assuming that a copy of the synchronization word may be present in the (random) data or ("no RE") that the data are constructed so as not to include a copy of the synchronization word. Curve 7 is the result of a simulation in which each frame is formed from 40 bits of payload data and a 5-bit synchronization word (20 bits of the payload preceding the synchronization word and the remaining 20 bits of the payload following the synchronization word), and four termination bits, two for starting and two for terminating (which may be included to lead the encoder toward state zero). In the simulation, code rate of the error correcting code is 1/2, and, as such, the total length of each frame is 94 bits.

The term "processing circuit" is used herein to mean any combination of hardware, firmware, and software, employed to process data or digital signals. Processing circuit hardware may include, for example, application specific integrated circuits (ASICs), general purpose or special purpose central processing units (CPUs), digital signal processors (DSPs), graphics processing units (GPUs), and programmable logic devices such as field programmable gate arrays (FPGAs). In a processing circuit, as used herein, each function is performed either by hardware configured, i.e., hard-wired, to perform that function, or by more general purpose hardware, such as a CPU, configured to execute instructions stored in a non-transitory storage medium. A processing circuit may be fabricated on a single printed wiring board (PWB) or distributed over several interconnected PWBs. A processing circuit may contain other processing circuits; for example a processing circuit may include two processing circuits, an FPGA and a CPU, interconnected on a PWB.

Although limited embodiments of a system and method for frame synchronization have been specifically described and illustrated herein, many modifications and variations will be apparent to those skilled in the art. Accordingly, it is to be understood that a system and method for frame synchronization employed according to principles of this invention may be embodied other than as specifically described herein. The invention is also defined in the following claims, and equivalents thereof.

What is claimed is:

1. A method for processing a frame in a data transmission system comprising a transmitter and a receiver, the method comprising:
   processing a second plurality of bits from among a first plurality of bits, with a first trellis decoder, to form a third plurality of bits;
   identifying the position of a first synchronization word within the third plurality of bits; and extracting a decoded data payload from the first plurality of bits;
   wherein the extracting of the decoded data payload comprises:
   identifying a first frame start position within the first plurality of bits, the first frame start position preceding the position of a bit, in the first plurality of bits, corresponding to a first bit of the first synchronization word, by a set number of bits;
   initializing a second trellis decoder to a set initial state; and
   processing a fourth plurality of bits, from among the first plurality of bits, with the second trellis decoder, a first bit of the fourth plurality of bits being a bit at the first frame start position within the first plurality of bits.

2. The method of claim 1, wherein the set number is greater than 0.1 times the number of bits in the first plurality of bits and the set number is less than 0.8 times the number of bits in the first plurality of bits.

3. The method of claim 1, wherein the first trellis decoder is the same as the second trellis decoder.

4. The method of claim 1, wherein the second plurality of bits is the same as the first plurality of bits.

5. A method for processing a frame in a data transmission system comprising a transmitter and a receiver, the method comprising:
   processing a second plurality of bits from among a first plurality of bits, with a first trellis decoder, to form a third plurality of bits;
   identifying the position of a first synchronization word within the third plurality of bits; and extracting a decoded data payload from the first plurality of bits;
   receiving, in the receiver, a plurality of soft bit decisions; generating a plurality of candidate frame start positions, each associated with a respective probability; forming a third plurality of bits from the plurality of soft bit decisions, a first one of the third plurality of bits corresponding to a bit at a first start position of the candidate frame start positions; initializing a second trellis decoder to a set initial state; processing the third plurality of bits with the second trellis decoder, to generate a set of decoded bits and a bit error count; when the bit error count is less than or equal to a threshold: outputting the third plurality of bits; and when the bit error count is greater than the threshold: forming a fourth plurality of bits from the plurality of soft bit decisions, a first one of the third plurality of bits corresponding to a bit at a second start position of the candidate frame start positions, the second start position having associated with it a lower probability than the first start position; initializing the second trellis decoder to the set initial state; and processing the fourth plurality of bits with the second trellis decoder, to generate a set of decoded bits and a bit error count.

6. The method of claim 5, wherein the generating of the plurality of candidate frame start positions comprises correlating a second synchronization word against the plurality of soft bit decisions.

7. The method of claim 6, further comprising:
receiving, in the transmitter, a sixth plurality of bits;
inserting, into the sixth plurality of bits, the second synchronization word, to form a seventh plurality of bits;
encoding the seventh plurality of bits with a convolutional encoder to form an eighth plurality of bits; and
transmitting the eighth plurality of bits to the receiver.

8. The method of claim 7, wherein the inserting into the sixth plurality of bits, of the second synchronization word, comprises inserting the second synchronization word at a position in the sixth plurality of bits such that:
at least 10% of the sixth plurality of bits precede the second synchronization word in the seventh plurality of bits; and
at least 10% of the sixth plurality of bits precede the inserted in the seventh plurality of bits.

9. The method of claim 8, wherein the second synchronization word is a Barker code.

10. A system for processing a frame in a data transmission system comprising a transmitter and a receiver, the system comprising a processing circuit configured to:
process a second plurality of bits from among a first plurality of bits, with a first trellis decoder, to form a third plurality of bits;
identify the position of a first synchronization word within the third plurality of bits; and extract a decoded data payload from the first plurality of bits;
wherein the extracting of the decoded data payload comprises: identifying a first frame start position within the first plurality of bits, the first frame start position preceding the position of a bit, in the first plurality of bits, corresponding to a first bit of the first synchronization word, by a set number of bits;
initializing a second trellis decoder to a set initial state; and
processing a fourth plurality of bits, from among the first plurality of bits, with the second trellis decoder, a first bit of the fourth plurality of bits being a bit at the first frame start position within the first plurality of bits.

11. The system of claim 10, wherein the set number is greater than 0.1 times the number of bits in the first plurality of bits and the set number is less than 0.8 times the number of bits in the first plurality of bits.

12. The system of claim 10, wherein the first trellis decoder is the same as the second trellis decoder.

13. The system of claim 10, wherein the second plurality of bits is the same as the first plurality of bits.

14. A system for processing a frame in a data transmission system comprising a transmitter and a receiver, the system comprising a processing circuit configured to:
process a second plurality of bits from among a first plurality of bits, with a first trellis decoder, to form a third plurality of bits;
identify the position of a first synchronization word within the third plurality of bits; and extract a decoded data payload from the first plurality of bits;
wherein the processing circuit is further configured to:
receive, in the receiver, a plurality of soft bit decisions;
generate a plurality of candidate frame start positions, each associated with a respective probability; form a third plurality of bits from the plurality of soft bit decisions, a first one of the third plurality of bits corresponding to a bit at a first start position of the candidate frame start positions; initialize a second trellis decoder to a set initial state; process the third plurality of bits with the second trellis decoder, to generate a set of decoded bits and a bit error count; when the bit error count is less than or equal to a threshold: output the third plurality of bits; and when the bit error count is greater than the threshold: form a fourth plurality of bits from the plurality of soft bit decisions, a first one of the third plurality of bits corresponding to a bit at a second start position of the candidate frame start positions, the second start position having associated with it a lower probability than the first start position; initialize the second trellis decoder to the set initial state; and process the fourth plurality of bits with the second trellis decoder, to generate a set of decoded bits and a bit error count.

15. The system of claim 14, wherein the generating of the plurality of candidate frame start positions comprises correlating a second synchronization word against the plurality of soft bit decisions.

16. The system of claim 15, wherein the processing circuit is further configured to:
receiving, in the transmitter, a sixth plurality of bits;
inserting, into the sixth plurality of bits, the second synchronization word, to form a seventh plurality of bits;
encoding the seventh plurality of bits with a convolutional encoder to form an eighth plurality of bits; and
transmitting the eighth plurality of bits to the receiver.

17. The system of claim 16, wherein the inserting into the sixth plurality of bits, of the second synchronization word, comprises inserting the second synchronization word at a position in the sixth plurality of bits such that:
at least 10% of the sixth plurality of bits precede the second synchronization word in the seventh plurality of bits; and
at least 10% of the sixth plurality of bits precede the inserted in the seventh plurality of bits.

18. The system of claim 17, wherein the second synchronization word is a Barker code.

* * * * *